(12) United States Patent
Chu et al.

(10) Patent No.: US 11,974,474 B2
(45) Date of Patent: Apr. 30, 2024

(54) ORGANIC LIGHT-EMITTING DISPLAY APPARATUS AND METHOD OF MANUFACTURING THE SAME

(71) Applicant: SAMSUNG DISPLAY CO., LTD., Yongin-si (KR)

(72) Inventors: Jaehwan Chu, Yongin-si (KR); Keunwoo Kim, Yongin-si (KR); Taewook Kang, Yongin-si (KR); Doona Kim, Yongin-si (KR); Sangsub Kim, Yongin-si (KR); Bummo Sung, Yongin-si (KR); Dokyeong Lee, Yongin-si (KR); Yongsu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 495 days.

(21) Appl. No.: 17/158,362

(22) Filed: Jan. 26, 2021

(65) Prior Publication Data
US 2021/0343821 A1 Nov. 4, 2021

(30) Foreign Application Priority Data
Apr. 29, 2020 (KR) .................. 10-2020-0052904

(51) Int. Cl.
*H01L 27/32* (2006.01)
*G09G 3/3233* (2016.01)
*H10K 59/131* (2023.01)

(52) U.S. Cl.
CPC ......... *H10K 59/131* (2023.02); *G09G 3/3233* (2013.01)

(58) Field of Classification Search
CPC ............ G09G 3/3233; H01L 21/02164; H01L 21/0217; H01L 27/1222; H01L 27/1225;
(Continued)

(56) References Cited

U.S. PATENT DOCUMENTS 9,735,219 B2 8/2017 An et al.
2014/0131666 A1* 5/2014 Song .................... H10K 50/858
257/40

(Continued)

FOREIGN PATENT DOCUMENTS

KR 10-2019-0015740 2/2019
KR 10-2019-0032792 12/2019
(Continued)

*Primary Examiner* — Stacy Khoo
(74) *Attorney, Agent, or Firm* — F. Chau & Associates, LLC

(57) ABSTRACT

An organic light-emitting display apparatus includes an organic light-emitting diode, a driving transistor configured to control an amount of electric current flowing to the organic light-emitting diode from a power line, a compensation transistor configured to diode-connect the driving transistor in response to a voltage applied to first and second compensation gate electrodes of the compensation transistor, and a gate insulating layer between the compensation gate electrodes and a compensation active region of a compensation transistor. A layer structure of the gate insulating layer between the first compensation gate electrode and the compensation active region is different from a layer structure of the gate insulating layer between the second compensation gate electrode and the compensation active region.

26 Claims, 10 Drawing Sheets

(58) Field of Classification Search
CPC ........... H01L 27/1237; H01L 29/42364; H01L 29/42384; H01L 29/78645; H10K 59/1213; H10K 59/123; H10K 59/131
See application file for complete search history.

(56) References Cited

U.S. PATENT DOCUMENTS

| | | |
|---|---|---|
| 2015/0102355 A1 | 4/2015 | Yang |
| 2016/0049453 A1* | 2/2016 | Kang ................ H01L 29/42384 438/151 |
| 2017/0317158 A1* | 11/2017 | Choi .................... H10K 59/123 |
| 2017/0330927 A1 | 11/2017 | Lee et al. |
| 2019/0237016 A1 | 8/2019 | Yoon et al. |
| 2019/0385523 A1 | 12/2019 | Na et al. |
| 2019/0393277 A1 | 12/2019 | An et al. |

FOREIGN PATENT DOCUMENTS

| | | | |
|---|---|---|---|
| KR | 10-2019-0143806 | 12/2019 | |
| KR | 10-2020-000508 | 1/2020 | |
| WO | WO-2019100394 A1 * | 5/2019 | ............... G09G 3/36 |

\* cited by examiner

ORGANIC LIGHT-EMITTING DISPLAY APPARATUS AND METHOD OF MANUFACTURING THE SAME

CROSS-REFERENCE TO RELATED APPLICATION

This U.S. non-provisional patent application claims the benefit of priority under 35 U.S.C. § 119 to Korean Patent Application No. 10-2020-0052904, filed on Apr. 29, 2020, in the Korean Intellectual Property Office, the disclosure of which is incorporated by reference in its entirety herein.

TECHNICAL FIELD

The present disclosure relates to an organic light-emitting display apparatus and a method of manufacturing the same, and more particularly, to an organic light-emitting display apparatus capable of displaying high quality images and a method of manufacturing the same.

DISCUSSION OF RELATED ART

A display device such as a flat-panel display (FPD) is an electronic device used by people to view content (e.g., still/moving images). An FPD device is far lighter, thinner, and uses less power than a traditional cathode ray tube (CRT) device. The display device includes a plurality of pixels, where each pixel includes a display element and a pixel circuit for controlling an electrical signal transmitted to the display element. The pixel circuit includes one or more transistors. However, under certain circumstances, the compensation transistor contributes to a kick back voltage occurring at a gate node of the driving transistor, which causes an afterimage to be perceived. Thus, the quality of images generated by a display device including the pixel circuit needs to be improved.

SUMMARY

According to an exemplary embodiment of the disclosure, an organic light-emitting display apparatus includes an organic light-emitting diode, a driving transistor, a compensation transistor, and a gate insulating layer. The driving transistor is configured to control, in response to a voltage applied to a first node connected to a driving gate electrode of the driving transistor, an amount of electric current flowing from to the organic light-emitting diode from a second node connected to a power voltage line. The compensation is transistor connected between the first node and a third node, and is configured to diode-connect the driving transistor in response to a voltage applied to first and second compensation gate electrodes of the compensation transistor disposed on a same layer. The third node is between the driving transistor and the organic light-emitting diode. The gate insulating layer is between the compensation gate electrodes and a compensation active region of the compensation transistor. A layer structure of the gate insulating layer between the first compensation gate electrode and the compensation active region is different from a layer structure of the gate insulating layer between the second compensation gate electrode and the compensation active region.

A first compensation portion of the gate insulating layer between the first compensation gate electrode and the compensation active region may have a single-layer structure, and a second compensation portion of the gate insulating layer between the second compensation gate electrode and the compensation active region may have a multi-layer structure.

A semiconductor layer including the compensation active region may be connected to a semiconductor layer including a driving active region of the driving transistor, and in the semiconductor layer, a portion corresponding to the first compensation gate electrode may be connected to a portion corresponding to a driving gate electrode of the driving transistor through a portion corresponding to the second compensation gate electrode.

A thickness of the first compensation portion may be equal to a thickness of the second compensation portion.

The second compensation portion may include a first layer including a material that is included in the first compensation portion and a second layer including a material that is different from the material included in the first compensation portion.

A dielectric constant of the material included in the second layer may be greater than a dielectric constant of the material included in the first layer.

The second layer may be closer to the second compensation gate electrode than the first layer.

The first layer may include silicon oxide and the second layer may include silicon nitride.

The first layer and the first compensation portion may be integrally formed as a single body.

The gate insulating layer may be interposed between a driving gate electrode of the driving transistor and the driving active region of the driving transistor, and a driving portion of the gate insulating layer between the driving gate electrode and the driving active region may have a multi-layer structure.

The driving portion and the second compensation portion may each include a first layer including a material that is included in the first compensation portion and a second layer including a material that is different from the material included in the first compensation portion.

A dielectric constant of the material included in the second layer may be greater than a dielectric constant of the material included in the first layer.

The second layer may be closer to the second compensation gate electrode than the first layer.

The first layer may include silicon oxide and the second layer may include silicon nitride.

The first layer and the first compensation portion may be integrally formed as a single body.

The organic light-emitting display apparatus may further include an initialization transistor connected between the first node and an initialization voltage line, the initialization transistor being configured to initialize a voltage at the driving gate electrode of the driving transistor in response to a voltage applied to a initialization gate electrode, wherein the gate insulating layer may be interposed between the initialization gate electrode and an initialization active region of the initialization transistor, and an initialization portion of the gate insulating layer between the initialization gate electrode and the initialization active region may have a multi-layer structure.

The initialization portion and the second compensation portion may each include a first layer including a material that is included in the first compensation portion and a second layer including a material that is different from the material included in the first compensation portion.

A dielectric constant of the material included in the second layer may be greater than a dielectric constant of the material included in the first layer.

The second layer may be closer to the second compensation gate electrode than the first layer.

The first layer may include silicon oxide and the second layer includes silicon nitride.

The first layer and the first compensation portion may be integrally formed as a single body.

In the compensation active region, a portion overlapping the first compensation gate electrode may have an area less than an area of a portion overlapping the second compensation gate electrode.

In the compensation active region, a channel length of a portion overlapping the first compensation gate electrode may be less than a channel length of a portion overlapping the second compensation gate electrode.

According to an exemplary embodiment of the disclosure, a pixel circuit for an organic light-emitting display apparatus includes a driving transistor, a compensation transistor, and a gate insulating layer. The driving transistor configured to control an amount of electric current flowing to the organic light-emitting diode from a power line, a compensation transistor configured to diode-connect the driving transistor in response to a voltage applied to first and second compensation gate electrodes of the compensation transistor, and a gate insulating layer between the compensation gate electrodes and a compensation active region of the compensation transistor. A layer structure of the gate insulating layer between the first compensation gate electrode and the compensation active region is different from a layer structure of the gate insulating layer between the second compensation gate electrode and the compensation active region.

According to an exemplary embodiment of the disclosure, an organic light-emitting display apparatus includes an organic light-emitting diode, a driving transistor, a compensation transistor, and a gate insulating layer. The driving transistor configured to control an amount of electric current flowing to the organic light-emitting diode from a power voltage line. The compensation transistor is configured to diode-connect the driving transistor in response to a voltage applied to first and second compensation gate electrodes of the compensation transistor. The gate insulating layer is between the compensation gate electrodes and a compensation active region of the compensation transistor. A first compensation portion of the gate insulating layer between the first compensation gate electrode and the compensation active region has a single-layer structure, and a second compensation portion of the gate insulating layer between the second compensation gate electrode and the compensation active region has a multi-layer structure.

BRIEF DESCRIPTION OF THE DRAWINGS

The above and other aspects, features, and elements of certain embodiments of the disclosure will be more apparent from the following description taken in conjunction with the accompanying drawings, in which.

DETAILED DESCRIPTION

Figure 1:
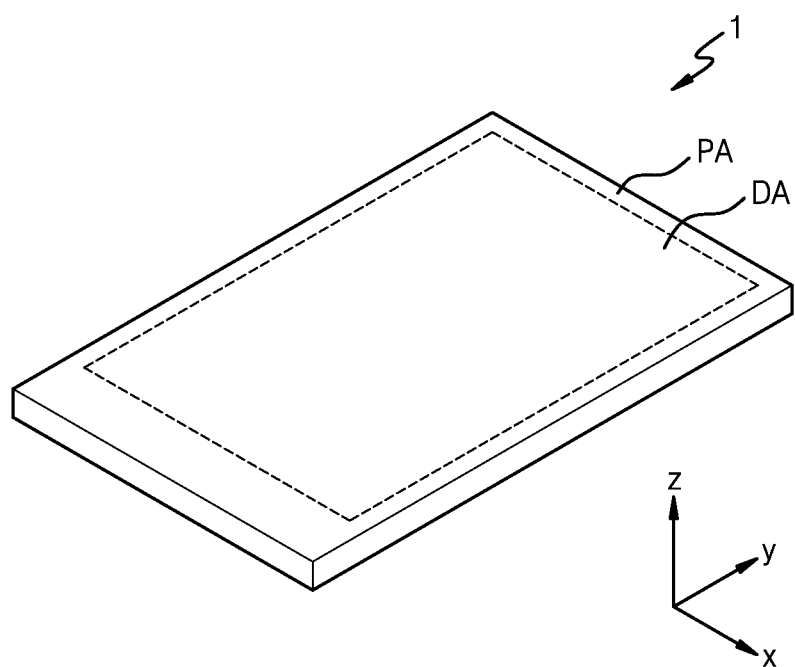
FIG. 1 is a conceptual diagram illustrating a display apparatus according to an exemplary embodiment of the disclosure.

Reference will now be made in detail to exemplary embodiments, examples of which are illustrated in the accompanying drawings. Like reference numerals refer to like elements throughout the drawings and the specification. In this regard, the present invention may have different forms and should not be necessarily construed as being limited to the descriptions set forth herein. Accordingly, the several embodiments are described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in detail in the written description. The attached drawings for illustrating one or more embodiments are referred to for aiding the reader in understanding the present disclosure, the merits thereof, and objectives accomplished by the implementation of the present disclosure. The disclosure, may, however, be embodied in many different forms and is not necessarily limited to the exemplary embodiments set forth herein.

It will be understood that when an element such as a layer, film, region or substrate is referred to as being placed "on" another element, it can be directly placed on the other element, or an intervening layer(s) may also be present. Sizes of components in the drawings may be exaggerated for convenience of explanation. In other words, since sizes and thicknesses of components in the drawings are illustrated for convenience of explanation, the following embodiments are not necessarily limited thereto.

The x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

FIG. 1 is a conceptual diagram illustrating a display apparatus 1 according to an exemplary embodiment of the disclosure.

A display apparatus according to the embodiment may be implemented as an electronic device such as a smartphone, a mobile phone, a navigation device, a game console, a TV, a vehicle head unit, a laptop computer, a tablet computer, a personal media player (PMP), a personal digital assistant (PDA), etc. Also, the electronic device may be a flexible device.

As shown in FIG. 1, the display apparatus 1 according to the embodiment has a display area DA and a peripheral area PA. The peripheral area PA may surround the display area DA. In an embodiment, the display area DA includes pixels for displaying an image and the peripheral area PA does not include pixels. The display apparatus 1 may include a substrate 101 (see FIG. 5), and the substrate 101 is not limited to a rectangular shape (on an xy plane) as shown in FIG. 1, but may have various shapes such as a circular shape. Also, the substrate 101 may have a bending area to be bent at the bending area. For example, the display device 1 may be bendable.

The substrate 101 may include glass or metal. Also, the substrate 101 may include various flexible or bendable materials. For example, the substrate 101 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate.

In an exemplary embodiment, the substrate 101 has a multi-layer structure including two layers including the polymer resin and a barrier layer including an inorganic material between the two layers. For example, the barrier layer may include silicon oxide, silicon nitride, and/or silicon oxynitride.

A plurality of display elements may be in the display area DA. For example, the display element may include an organic light-emitting diode OLED, and may emit red light, green light, blue light, or white light. A (sub-)pixel in the display area DA of the display apparatus 1 shown in FIG. 1 includes an organic light-emitting diode, and also include a thin film transistor for controlling the light emitting intensity of the organic light-emitting diode and a capacitor.

A driver and a line (or wire) such as a power supply line may be arranged in the peripheral area PA. Also, the peripheral area PA may include a pad area to which various electronic devices such as a driving integrated circuit (IC) or a printed circuit board are electrically bonded. The pad area may include pads (e.g., conductive elements). Various wires for transmitting electrical signals to the display area DA, the printed circuit board, or the driving IC may be attached to the pads.

Figure 2:
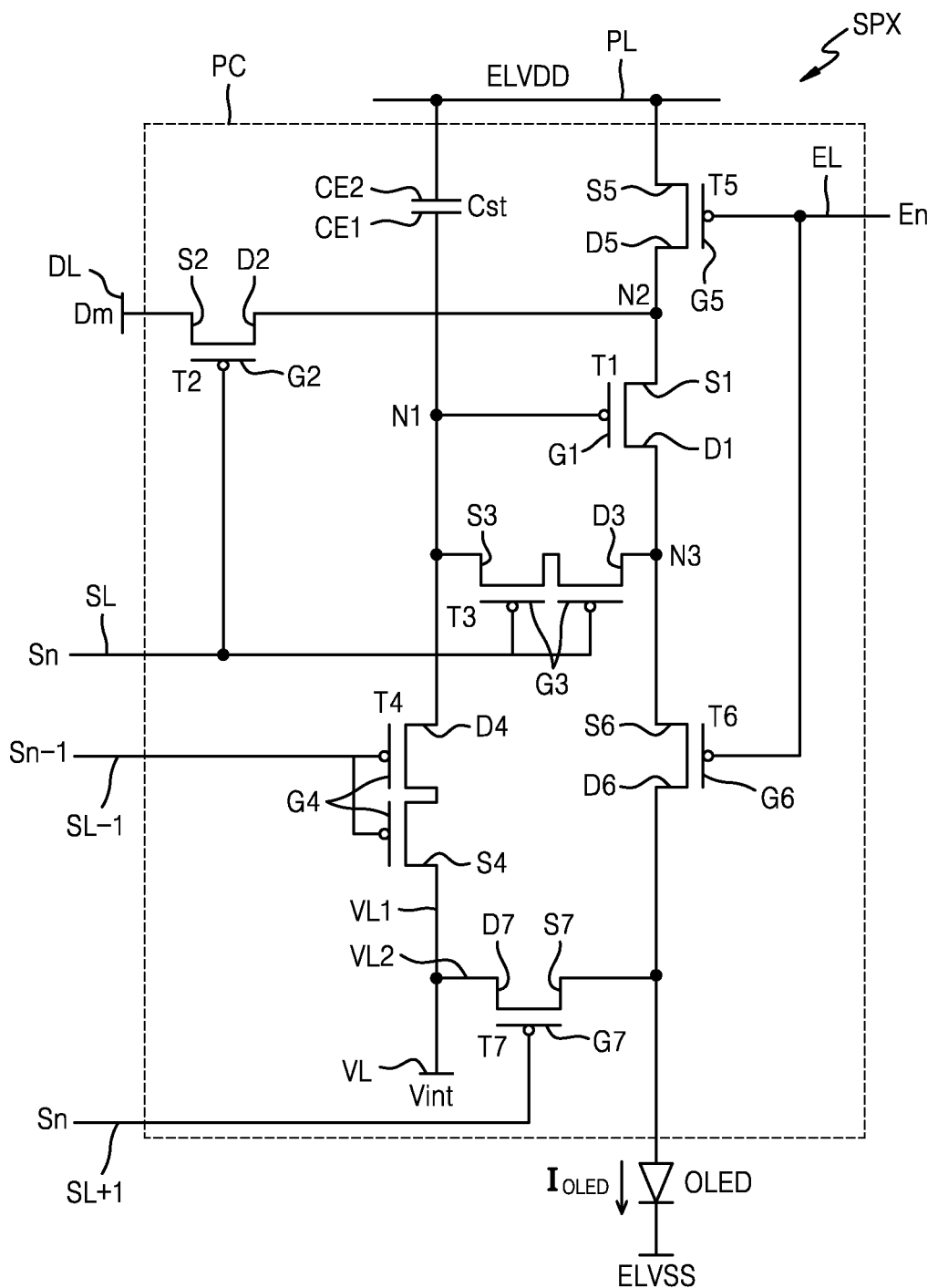
FIG. 2 is an equivalent circuit diagram illustrating a pixel included in the display apparatus of FIG. 1 according to an exemplary embodiment of the disclosure.

FIG. 2 is an equivalent circuit diagram illustrating one (sub-)pixel in the display area DA of the display apparatus 1 of FIG. 1 according an exemplary embodiment of the disclosure. The (sub-)pixel may refer to a pixel or a sub-pixel.

Referring to FIG. 2, a (sub-)pixel SPX includes an organic light-emitting diode OLED as a display element and a pixel circuit PC (or pixel circuit portion) connected to the organic light-emitting diode OLED. The pixel circuit PC may include a plurality of thin film transistors T1 to T7 and a storage capacitor Cst. According to types (p-type or n-type) and/or operation conditions of transistors, a first terminal of each of the first to seventh transistors T1 to T7 may be a source terminal or a drain terminal, and a second terminal thereof may be different from the first terminal. For example, when the first terminal is a source terminal, the second terminal may be a drain terminal. In an embodiment, the first to seventh transistors T1 to T7 may be implemented by a p-channel multi-oxide semiconductor field effect transistor MOSFET or a p-channel metal oxide semiconductor (PMOS) transistor.

The first transistor T1 may be referred to as a driving transistor. The second transistor T2 may be referred to as a switching transistor. The third transistor T3 may be referred to as a compensation transistor. The fourth transistor T4 may be referred to as a first initialization transistor. The fifth transistor T5 may be referred to as an operation control transistor. The sixth transistor T6 may be referred to as an emission control transistor. The seventh transistor T7 may be referred to as a second initialization transistor.

The thin film transistors T1 to T7 and the storage capacitor Cst may be connected to signal lines SL, SL−1, SL+1, EL, and DL, a first initialization voltage line VL1, a second initialization voltage line VL2, and a power voltage line PL.

Figure 3:
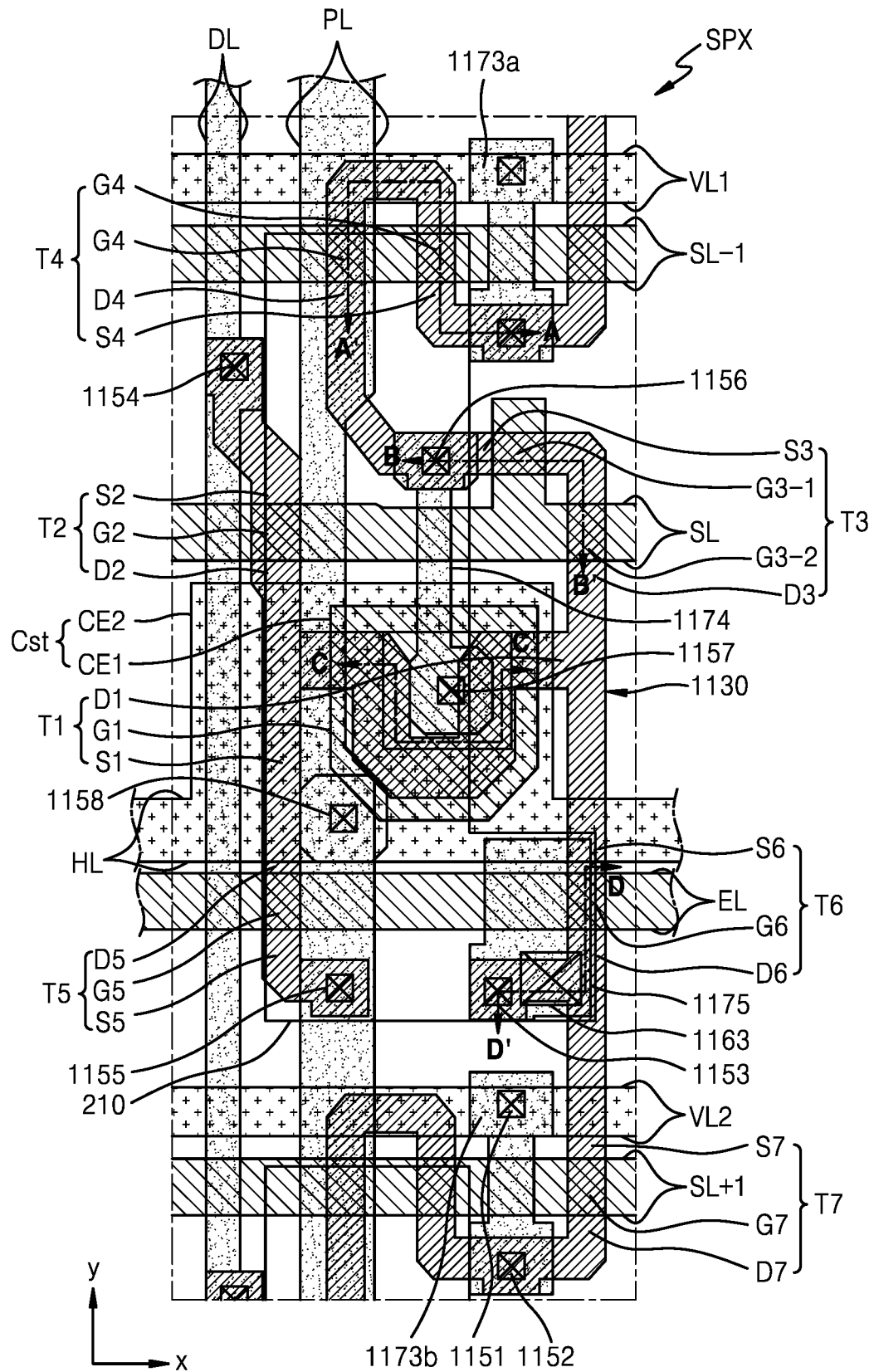
FIG. 3 is a layout showing locations of thin film transistors and a capacitor in the pixel of FIG. 2 according to an exemplary embodiment of the disclosure.

The signal lines SL, SL−1, SL+1, EL, and DL may include a scan line SL configured to transfer a scan signal Sn, a previous scan line SL−1 configured to transfer a previous scan signal Sn-1 to a first initialization thin film transistor T4, a next scan line SL+1 configured to transfer the scan signal Sn to a second initialization thin film transistor T7, an emission control line EL configured to transfer an emission control signal En to an operation control thin film transistor T5 and an emission control thin film transistor T6, and a data line DL intersecting (or crossing) with the scan line SL and configured to transfer a data signal Dm. The power voltage line PL may be configured to transfer a driving voltage ELVDD to a driving thin film transistor T1. A first initialization voltage line VL1 may be configured to transfer an initialization voltage Vint to the first initialization thin film transistor T4. A second initialization voltage line VL2 may be configured to transfer an initialization voltage Vint to the second initialization thin film transistor T7. As shown in FIGS. 2 and 3, the first initialization voltage line VL1 and the second initialization voltage line VL2 may be connected to an initialization voltage line VL.

A driving gate electrode G1 of the driving thin film transistor T1 is connected to a lower electrode CE1 of the storage capacitor Cst. A driving source region S1 of the driving thin film transistor T1 is connected to the power voltage line PL via the operation control thin film transistor T5. A driving drain region D1 of the driving thin film transistor T1 is electrically connected to a pixel electrode of the main organic light-emitting diode OLED via the emission control thin film transistor T6. That is, in response to a voltage applied to a first node N1 (e.g., a voltage applied to the driving gate electrode G1), the driving thin film transistor T1 may control an amount of electric current flowing from a second node N2 connected to the power voltage line PL to the organic light-emitting diode OLED. Accordingly, the driving thin film transistor T1 receives the data signal Dm according to a switching operation of the switching thin film transistor T2 to supply a driving current $I_{OLED}$ to the organic light-emitting diode OLED. The operation control thin film transistor T5 may be interposed between the second node N2 and the power voltage line PL.

A switching gate electrode G2 of the switching thin film transistor T2 is connected to the scan line SL. A switching source region S2 of the switching thin film transistor T2 is connected to the data line DL. A switching drain region D2 of the switching thin film transistor T2 is connected to the second node N2 and thus connected to the driving source region S1 of the driving thin film transistor T1, and is also connected to the power voltage line PL via the operation control thin film transistor T5. The switching thin film transistor T2 is turned on according to the scan signal Sn received through the scan line SL and performs a switching operation for transferring the data signal Dm transferred through the data line DL to the driving source region S1 of the driving thin film transistor T1.

The compensation thin film transistor T3, is connected between a third node N3 and the first node N1, and may diode-connect the driving thin film transistor T1 in response to the voltage applied to a compensation gate electrode G3 of the compensation thin film transistor T3. The third node N3 is a position between the driving thin film transistor T1 and the organic light-emitting diode OLED. That is, the compensation gate electrode G3 of the compensation thin film transistor T3 is connected to the scan line SL, the compensation drain region D3 of the compensation thin film transistor T3 is connected to the pixel electrode of the organic light-emitting diode OLED via the emission control thin film transistor T6 while being connected to the driving drain region D1 of the driving thin film transistor T1, and the compensation source region S3 of the compensation thin film transistor T3 is connected to the lower electrode CE1 of the storage capacitor Cst, a first initialization drain region D4 of the first initialization thin film transistor T4, and the driving gate electrode G1 of the driving thin film transistor T1.

The compensation thin film transistor T3 is turned on according to the scan signal Sn received through the scan line SL to electrically connect the driving gate electrode G1 and the driving drain region D1 of the driving thin film transistor T1 to each other and to diode-connect the driving thin film transistor T1. The compensation thin film transistor T3 has a dual-gate electrode. That is, the compensation gate electrode G3 of the compensation thin film transistor T3 has a first compensation gate electrode G3-1 (see FIG. 3) and a second compensation gate electrode G3-2 (see FIG. 3).

The first initialization thin film transistor T4 is connected between the first node N1 and the first initialization voltage line VL1 to initialize the voltage at the driving gate electrode G1 in response to the voltage applied to the first initialization gate electrode G4 of the first initialization thin film transistor T4. That is, the first initialization gate electrode G4 of the first initialization thin film transistor T4 is connected to the previous scan line SL−1, a first initialization source region S4 of the first initialization thin film transistor T4 is connected to the first initialization voltage line VL1, and a first initialization drain region D4 of the first initialization thin film transistor T4 is connected to the lower electrode CE1 of the storage capacitor Cst, the compensation source region S3 of the compensation thin film transistor T3, and the driving gate electrode G1 of the driving thin film transistor T1. The first initialization thin film transistor T4 is turned on according to a previous scan signal Sn−1 transferred through the previous scan line SL−1 to transfer the initialization voltage Vint to the driving gate electrode G1 of the driving thin film transistor T1 and perform an initialization operation for initializing a voltage at the driving gate electrode G1 of the driving thin film transistor T1.

The operation control thin film transistor T5 is connected between the second node N2 and the power voltage line PL, and may be turned on in response to a voltage applied to an operation control gate electrode G5 of the operation control thin film transistor T5. That is, the operation control gate electrode G5 of the operation control thin film transistor T5 is connected to the emission control line EL, an operation source region S5 of the operation control thin film transistor T5 is connected to the power voltage line PL, and an operation control drain region D5 of the operation control thin film transistor T5 is connected to the driving source region S1 of the driving thin film transistor T1 and the switching drain region D2 of the switching thin film transistor T2.

The emission control thin film transistor T6 is connected between the third node N3 and the organic light-emitting diode OLED, and may be turned on in response to a voltage applied from the emission control line EL to an emission control gate electrode G6 of the emission control thin film transistor T6. That is, the emission control gate electrode G6 of the emission control thin film transistor T6 is connected to the emission control line EL, the emission control source region S6 of the emission control thin film transistor T6 is connected to the driving drain region D1 of the driving thin film transistor T1 and the compensation drain region D3 of the compensation thin film transistor T3, and the emission control drain region D6 of the emission control thin film transistor T6 is connected to a second initialization source region S7 of the second initialization thin film transistor T7 and the pixel electrode of the organic light-emitting diode OLED.

The operation control thin film transistor T5 and the emission control thin film transistor T6 are simultaneously turned on (or turned on during a same period) according to the emission control signal En transferred through the emission control line EL to transfer the driving voltage ELVDD to the main organic light-emitting diode OLED and to allow a driving current $I_{OLED}$ to flow in the organic light-emitting diode OLED.

A second initialization gate electrode G7 of the second initialization thin film transistor T7 is connected to a next scan line SL+1. A second initialization source region S7 of the second initialization thin film transistor T7 is connected to the emission control drain region D6 of the emission control thin film transistor T6 and the pixel electrode of the main organic light-emitting diode OLED, and a second initialization drain region D7 of the second initialization thin film transistor T7 is connected to the second initialization voltage line VL2.

In an embodiment where the scan line SL and the next scan line SL+1 are electrically connected to each other, and a same scan signal Sn is applied to the scan line SL and the next scan line SL+1. Therefore, the second initialization thin film transistor T7 is turned on according to the scan signal Sn transferred through the next scan line SL+1 and performs an operation of initializing the pixel electrode of the organic light-emitting diode OLED. In an exemplary embodiment, the second initialization thin film transistor T7 is omitted.

An upper electrode CE2 of the storage capacitor Cst is connected to the power voltage line PL, and a common electrode of the organic light-emitting diode OLED is connected to a common voltage ELVSS. Accordingly, the organic light-emitting diode OLED emits light by receiving the driving current $I_{OLED}$ from the driving thin film transistor T1 to display images.

Although FIG. 2 shows the compensation thin film transistor T3 and the first initialization thin film transistor T4 including dual gate electrodes, the compensation thin film transistor T3 and the first initialization thin film transistor T4 may have one gate electrode in other embodiments.

Figure 4:
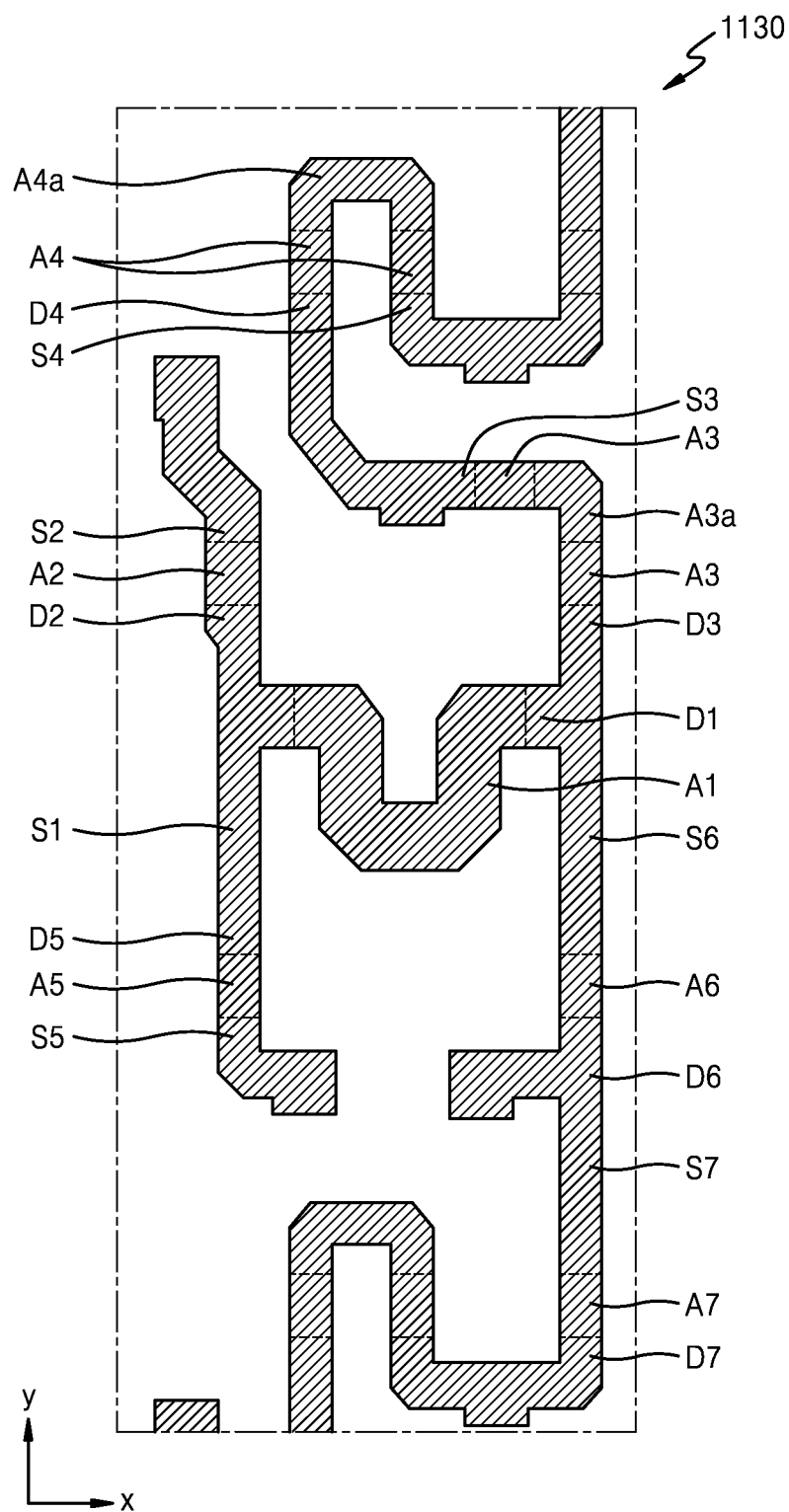
FIG. 4 is a layout illustrating a semiconductor layer of FIG. 3 according to an exemplary embodiment of the disclosure.
Figure 5:
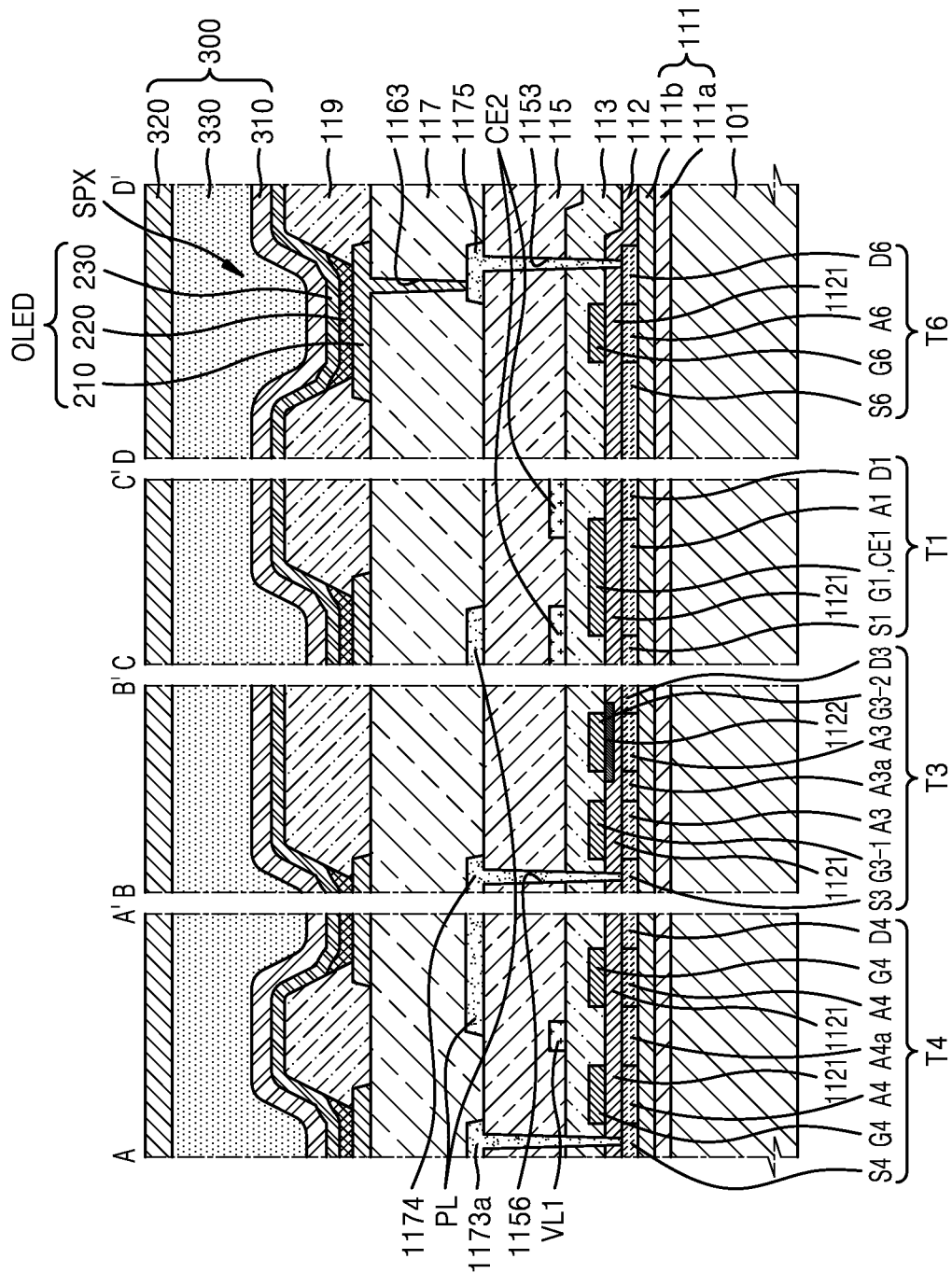
FIG. 5 is a cross-sectional view showing a part of FIG. 3 according to an exemplary embodiment of the disclosure.

FIG. 3 is a schematic layout diagram showing locations of the plurality of thin film transistors and the capacitor in the (sub-)pixel of FIG. 2 according to an exemplary embodiment of the disclosure. FIG. 4 is a schematic layout diagram of a semiconductor layer 1130 that is a portion of the display apparatus of FIG. 3. FIG. 5 is a cross-sectional view of a portion of FIG. 3 taken along line A-A', line B-B', line C-C', and line D-D'. A size of each element in the cross-sectional view is exaggerated and/or reduced for convenience of description. This also applies to the cross-sectional views that will be described later.

The driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along the semiconductor layer 1130. Some regions in the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. That is, some regions of the semiconductor layer 1130 may correspond to an active region, a source region, or a drain region of a thin film transistor.

The semiconductor layer 1130 may be on the substrate 101. A buffer layer 111 may be on the substrate 101, and the semiconductor layer 1130 may be on the buffer layer 111.

The buffer layer 111 may reduce or prevent infiltration of impurities, moisture, or external air from below the substrate 101, and may provide a planarized surface on the substrate 101. The buffer layer 111 may include an inorganic material such as an oxide material or a nitride material, an organic material, or an inorganic-organic composite material, and may have a single-layer or multi-layer structure including the inorganic material and the organic material. For example, the buffer layer 111 may include a stack structure including a first buffer layer 111a and a second buffer layer 111b, and the first buffer layer 111a and the second buffer layer 111b may include different materials from each other. For example, the first buffer layer 111a may include silicon nitride and the second buffer layer 111b may include silicon oxide.

As described above, in an embodiment where the first buffer layer 111a includes a silicon nitride material, the silicon nitride material includes hydrogen. As such, a carrier mobility of the semiconductor layer 1130 on the buffer layer 111 may be improved and electrical characteristics of the thin film transistor TFT may be improved. Also, the semiconductor layer 1130 may include a silicon material, and in this case, an interfacial bonding property between the semiconductor layer 1130 including silicon and the second buffer layer 111b including silicon oxide may be improved, thereby improving electrical characteristics of the thin film transistor TFT.

The semiconductor layer 1130 may include low temperature polysilicon or a Low Temperature Polycrystalline Silicon (LTPS). The polysilicon material has high electron mobility (100 cm$^2$/Vs or greater) and thus has low energy consumption and excellent reliability. In another example, the semiconductor layer 1130 may include amorphous silicon (a-Si) and/or oxide semiconductor. Alternatively, some of the semiconductor layers in the plurality of thin film transistors may include LTPS, and some of the other semiconductor layers may include amorphous silicon (a-Si) and/or oxide semiconductor.

The source regions and the drain regions of the semiconductor layer 1130 may be doped with impurities, and the impurities may include N-type impurities or P-type impurities. The source region and the drain region may respectively correspond to a source electrode and a drain electrode. The source region and the drain region may be exchanged with each other according to properties of the thin film transistor. Hereinafter, the terms "source region" and "drain region" are used instead of the source electrode and the drain electrode. In the equivalent circuit diagram of FIG. 2, certain portions of the semiconductor layer 1130 are doped with P-type impurities such that the thin film transistors are implemented as p-channel multi-oxide semiconductor field effect transistors (MOSFETs) or p-channel metal oxide semiconductor (PMOS) transistors. Other regions of the semiconductor layer 1130 may be also doped with impurities to act as wires electrically connecting the thin film transistors and/or the capacitor to one another.

A first gate insulating layer 112 is on the semiconductor layer 1130, and the driving gate electrode G1, the scan line SL, the previous scan line SL−1, the next scan line SL+1, and the emission control line EL may be on the first gate insulating layer 112. A detailed structure of the first gate insulating layer 112 will be described later.

In the scan line SL, regions overlapping second and third active regions A2 (e.g., a switching active region) and A3 (e.g., a compensation active region) of the switching and compensation thin film transistors T2 and T3 may respectively correspond to the switching gate electrode G2 and the compensation gate electrode G3. In the previous scan line SL−1, a region overlapping a fourth active region A4 (e.g., a first initialization active region) of the first initialization thin film transistor T4 may correspond to the first initialization gate electrode G4. In the next scan line SL+1, a region overlapping a seventh active region A7 (e.g., a second initialization active region) of the second initialization thin film transistor T7 may correspond to the second initialization gate electrode G7. In the emission control line EL, regions overlapping fifth and sixth active regions A5 (e.g., an operation control active region) and A6 (e.g., an emission control active region) of the operation control and emission control thin film transistors T5 and T6 may respectively correspond to the operation control gate electrode G5 and the emission control gate electrode G6. The semiconductor layer 1130 may further include an active region A3a between a pair of the third active regions A3, and an active region A4a between a pair of the fourth active regions A4.

The driving gate electrode G1, the scan line SL, the previous scan line SL−1, the next scan line SL+1, and the emission control line EL may include a conductive material including molybdenum (Mo), aluminum (Al), copper (Cu), or titanium (Ti) and may have a single-layer or multi-layer structure including the above materials. As an example, the driving gate electrode G1, the scan line SL, the previous scan line SL−1, the next scan line SL+1, and the emission control line EL may have a multi-layer structure including Mo/Al or Mo/Al/Mo.

A second gate insulating layer 113 may be on the driving gate electrode G1, the scan line SL, the previous scan line SL−1, the next scan line SL+1, and the emission control line EL. The second gate insulating layer 113 may include silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

An electrode voltage line HL, the first initialization voltage line VL1, and the second initialization voltage line VL2 may be on the second gate insulating layer 113. The electrode voltage line HL covers at least a part of the driving gate electrode G1, and may form the storage capacitor Cst with the driving gate electrode G1. In an exemplary embodiment, the electrode voltage line HL entirely covers the driving gate electrode G1.

The lower electrode CE1 of the storage capacitor Cst and the driving gate electrode G1 of the driving thin film transistor T1 may be integrally formed as a single body. For example, the driving gate electrode G1 of the driving thin film transistor T1 may function as the lower electrode CE1 of the storage capacitor Cst. In the electrode voltage line HL, a region overlapping the driving gate electrode G1 may function as the upper electrode CE2 of the storage capacitor Cst. Therefore, the second gate insulating layer 113 may act as a dielectric layer of the storage capacitor Cst.

The electrode voltage line HL, the first initialization voltage line VL1, and the second initialization voltage line VL2 may include a conductive material including molybdenum (Mo), aluminum (Al), copper (Cu), or titanium (Ti) and may have a single-layer or multi-layer structure including the above materials. As an example, the electrode voltage line HL, the first initialization voltage line VL1, and the second initialization voltage line VL2 may each have a multi-layer structure including Mo/Al or Mo/Al/Mo.

An interlayer insulating layer 115 is on the electrode voltage line HL, the first initialization voltage line VL1, and the second initialization voltage line VL2. The interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The data line DL, the power voltage line PL, first and second initialization connecting lines 1173a and 1173b, a node connecting line 1174, and a contact metal 1175 may be on the interlayer insulating layer 115. The data line DL, the power voltage line PL, the node connecting line 1174, and the contact metal 1175 may each include a conductive material including molybdenum (Mo), aluminum (Al), copper (Cu), titanium (Ti), etc., and may have a single-layer or multi-layer structure including the above materials. As an example, the data line DL, the power voltage line PL, the node connecting line 1174, and the contact metal 1175 may each have a multi-layer structure including Ti/Al/Ti.

The data line DL may be connected to the switching source region S2 of the switching thin film transistor T2 via a contact hole 1154. A part of the data line DL may correspond to the switching source region S2.

The power voltage line PL may be connected to the upper electrode CE2 of the capacitor Cst via a contact hole 1158 in the interlayer insulating layer 115. Therefore, the electrode voltage line HL may have the same voltage level (constant voltage) as the power voltage line PL. Also, the power voltage line PL may be connected to the operation control drain region D5 via a contact hole 1155.

The first initialization voltage line VL1 is connected to the first initialization thin film transistor T4 via the first initialization connecting line 1173a, and the second initialization voltage line VL2 may be connected to the second initialization thin film transistor T7 via the second initialization connecting line 1173b and contact holes 1151 and 1152. In addition, the first initialization voltage line VL1 and the second initialization voltage line VL2 may have the same contact voltage (e.g., −2V, etc.).

In an exemplary embodiment, an end of a node connecting line 1174 is connected to the compensation source region S3 via a contact hole 1156 and an opposite end of the node connecting line 1174 is connected to the driving gate electrode G1 via the contact hole 1157.

The contact metal 1175 is connected to the emission control drain region D6 of the emission control thin film transistor T6 via a contact hole 1153 that penetrates through the interlayer insulating layer 115, the second gate insulating layer 113, and the first gate insulating layer 112. The contact metal 1175 is connected to the pixel electrode 210 of the organic light-emitting diode OLED via a contact hole 1163. Therefore, the emission control thin film transistor T6 may be electrically connected to the pixel electrode 210 of the organic light-emitting diode OLED.

A planarization layer 117 is on the data line DL, the power voltage line PL, the first and second initialization connecting lines 1173a and 1173b, the node connecting line 1174, and the contact metal 1175. The organic light-emitting diode OLED may be arranged on the planarization layer 117.

Although FIG. 2 shows one pixel circuit PC and FIG. 3 illustrates a structure of one (sub-)pixel SPX, a plurality of sub-pixels SPX having the same pixel circuit PC may be arranged in a first direction (x-axis direction) and a second direction (y-axis direction). A plurality of sub-pixels SPX may share a line. For example, the first initialization voltage line VL1, the previous scan line SL−1, the second initialization voltage line VL2, and the next scan line SL+1 may be shared by two pixel circuits PC adjacent to each other in the second direction (y-axis direction).

That is, the first initialization voltage line VL1 and the previous scan line SL−1 may be electrically connected to a second initialization thin film transistor of another pixel circuit PC that is above the pixel circuit PC of FIG. 3 in a +y direction, in the second direction (y-axis direction) of the drawings. Therefore, a previous scan signal applied to the previous scan line SL−1 may be transferred to the second initialization thin film transistor of another pixel circuit PC as a next scan signal. Likewise, the second initialization voltage line VL2 and the next scan line SL+1 may be electrically connected to a first initialization thin film transistor of another pixel circuit PC that is adjacent to the pixel circuit PC of FIG. in a −y direction, in the second direction (y-axis direction) based on the drawings, and thus may transmit a previous scan signal and an initialization voltage to the first initialization thin film transistor of the other pixel circuit PC.

Referring back to FIG. 5, the planarization layer 117 may have a flat upper surface to make the pixel electrode 210 flat. The planarization layer 117 may include an organic material and may have a single-layer or multi-layer structure. The planarization layer 117 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, or blends thereof. In an exemplary embodiment, the planarization layer 117 includes an inorganic material. The planarization layer 117 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). When the planarization layer 117 includes the inorganic material, a chemical planarization polishing may be performed in some embodiments. Alternatively, the planarization layer 117 may include both an organic material and an inorganic material.

The organic light-emitting diode OLED may include the pixel electrode 210, a common electrode 230, and an intermediate layer 220 that is between the pixel electrode 210 and the common electrode 230 and include an emission layer.

The pixel electrode 210 may be connected to the contact metal 1175 via the contact hole 1163, and the contact metal 1175 may be connected to the emission control drain region D6 via the contact hole 1153. The pixel electrode 210 may include a (semi-) transmissive electrode or a reflective electrode. In some embodiments, the pixel electrode 210 may include a reflective layer including Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). In some embodiments, the pixel electrode 210 may include a stack structure including ITO/Ag/ITO.

A pixel defining layer 119 may be located on the planarization layer 117, and the pixel defining layer 119 includes an opening exposing a center portion of the pixel electrode 210 to define a light emitting region of the pixel. Also, the pixel defining layer 119 may prevent an arc from occurring at the edge of the pixel electrode 210 by increasing a distance between an edge of the pixel electrode 210 and the common electrode 230 on the pixel electrode 210. The pixel defining layer 119 may include an organic insulating material such as polyimide, polyamide, an acrylic resin, benzocyclobutene, hexamethyldisiloxane (HMDSO), and a phenol resin, and may be obtained by spin coating.

The intermediate layer 220 may include an organic light-emitting layer. The organic light-emitting layer may include an organic material including a fluorescent or phosphor material emitting red, green, blue, or white light. The organic light-emitting layer may include a low-molecular weight organic material or a polymer organic material, and functional layers such as a hole transport layer (HTL), a hole injection layer (HIL), an electron transport layer (ETL), and an electron injection layer (EIL) may be selectively arranged under and on the organic light-emitting layer. The intermediate layer 220 may correspond to each of the plurality of pixel electrodes 210. However, embodiments of the disclosure are not limited thereto, and layers such as the HTL, HIL, ETL, or EIL from among the layers included in the intermediate layer 220 may be integrally formed as a single body over the plurality of pixel electrodes 210.

The common electrode 230 may include a transmissive electrode or a reflective electrode. In an embodiment, the common electrode 230 may include a transparent or a semi-transparent electrode, and may include a metal thin film including Li, Ca, LiF, Ag, Mg, and a compound thereof having a small work function. Also, a transparent conductive oxide (TCO) layer including a material such as ITO, IZO, ZnO, or $In_2O_3$ may be further provided in addition to the metal thin film. The common electrode 230 may be integrally formed as a single body to correspond to the plurality of pixel electrodes 210.

An encapsulation layer 300 may be on the common electrode 230, wherein the encapsulation layer 300 includes a first inorganic encapsulation layer 310, a second inorganic encapsulation layer 320, and an organic encapsulation layer 330 between the first and second inorganic encapsulation layers 310 and 320.

The first inorganic encapsulation layer 310 and the second inorganic encapsulation layer 320 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The organic encapsulation layer 330 may include polyethylene terephthalate, polyethylene naphthalate, polycarbonate, polyimide, polyethylene sulfonate, polyoxymethylene, polyarylate, hexamethyl disiloxane, an acryl-based resin (e.g., polymethyl methacrylate, polyacrylic acid, etc.), or a combination thereof.

As described above, the first gate insulating layer 112 is on the semiconductor layer 1130, and the driving gate electrode G1, the scan line SL, the previous scan line SL−1, the next scan line SL+1, and the emission control line EL may be on the first gate insulating layer 112. The scan line SL, the previous scan line SL−1, the next scan line SL+1, and the emission control line EL include, as described above, the switching gate electrode G2, the compensation gate electrode G3, the first initialization gate electrode G4, the operation control gate electrode G5, the emission control gate electrode G6, and the second initialization gate electrode G7. Therefore, the first gate insulating layer 112 is interposed between the driving gate electrode G1, the switching gate electrode G2, the compensation gate electrode G3, the first initialization gate electrode G4, the operation control gate electrode G5, the emission control gate electrode G6, and the second initialization gate electrode G7, and the semiconductor layer 1130.

In an organic light-emitting display apparatus according to an exemplary embodiment of the disclosure, the first gate insulating layer 112 is between a first compensation gate electrode G3-1 and second compensation gate electrode G3-2 and the third active region A3 (e.g., a compensation active region) of the compensation thin film transistor T3. Here, a layer structure of the first gate insulating layer 112 between the first compensation gate electrode G3-1 and the third active region A3 is different from that of the first gate insulating layer 112 between the second compensation gate electrode G3-2 and the third active region A3.

As described above with reference to FIG. 2, the driving thin film transistor T1 receives the data signal Dm according to the switching operation of the switching thin film transistor T2, and supplies the driving current $I_{OLED}$ to the organic light-emitting diode OLED. That is, the voltage between the driving gate electrode G1 and the driving source region S1 in the driving thin film transistor T1 determines the driving current $I_{OLED}$ flowing in the organic light-emitting diode OLED. Here, when the threshold voltages $V_{th}$ of the driving thin film transistors T1 in a plurality of pixels are different from one another, magnitudes of the driving current $I_{OLED}$ flowing through the organic light-emitting diodes OLED are different even though the same data signal Dm is applied to a plurality of pixels. A display apparatus may be unable to display a high quality image when the sizes of the driving currents $I_{OLED}$ flowing through organic light-emitting diodes are different from each other while the same data signal Dm is applied to those several pixels.

The compensation thin film transistor T3 may be connected to each of the driving thin film transistors T1 to prevent the driving thin film transistors T1 from being affected by the threshold voltages Vth. Accordingly, even when the threshold voltages $V_{th}$ of the driving thin film transistors T1 in the plurality of pixels are different from one another, the magnitudes of the driving currents $I_{OLED}$ flowing on the organic light-emitting diodes OLED may be nearly equal to one another when the same data signal Dm is applied to the plurality of pixels.

The compensation thin film transistor T3 is completely turned off after compensating for the threshold voltage $V_{th}$ at a voltage difference between the driving gate electrode G1 and the driving source region S1 of the driving thin film transistor T1. However, because a parasitic capacitance occurs between the compensation gate electrode G3 and the third active region A3 of the compensation thin film transistor T3, a voltage variation occurs at the driving gate electrode G1 of the driving thin film transistor T1 due to a change in a charge amount caused by the parasitic capacitance. Accordingly, a kick-back phenomenon may occur in the display apparatus. The kick-back phenomenon refers to a flicker phenomenon in which a screen of the display apparatus flickers, or a phenomenon that a residual image remains on the screen.

To address the above issue, the parasitic capacitance at the compensation thin film transistor T3 needs to be reduced. In an exemplary embodiment of the disclosure, a thickness of the first gate insulating layer 112 is increased to reduce the parasitic capacitance. When the thickness of the first gate insulating layer 112 increases, a distance between the compensation gate electrode G3 and the third active region A3 increases, and accordingly, the parasitic capacitance therebetween may be reduced. However, when the thickness of the first gate insulating layer 112 increases between the compensation gate electrode G3 and the third active region A3, a sensitivity of the compensation thin film transistor T3 may degrade. That is, when electrical signals set in advance are applied to the compensation gate electrode G3, turning-on and turning-off at the compensation thin film transistor T3 may not be performed at an accurate time. Also, it may not be easy to finely control the change in the electric current flowing between the compensation source region S3 and the compensation drain region D3 by adjusting the electrical signal applied to the compensation gate electrode G3.

However, in an organic light-emitting display apparatus according to an exemplary embodiment of the disclosure, the layer structure of the first gate insulating layer 112 between the first compensation gate electrode G3-1 and the third active region A3 is different from that of the first gate insulating layer 112 between the second compensation gate electrode G3-2 and the third active region A3. Accordingly, the sensitivity of the compensation thin film transistor T3 may be improved while preventing or reducing the kick-back phenomenon.

In an exemplary embodiment of the disclosure, a first compensation portion of the first gate insulating layer 112 between the first compensation gate electrode G3-1 and the third active region A3 has a single-layer structure, and a second gate compensation portion of the first gate insulating layer 112 between the second compensation gate electrode G3-2 and the third active region A3 has a multi-layer structure. In an exemplary embodiment of the disclosure, the second gate compensation portion includes a first layer 1121 including a same material as that of the first compensation portion, and a second layer 1122 including a different material from that of the first compensation portion. In an exemplary embodiment of the disclosure, the material included in the second layer 1122 has a dielectric constant that is greater than the dielectric constant of the material included in the first layer 1121. For example, the first layer 1121 may include silicon oxide and the second layer 1122 may include silicon nitride. Silicon oxide has a dielectric constant of about 3.7, and silicon nitride has a dielectric constant of about 7.5.

In an organic light-emitting display apparatus according to an exemplary embodiment, the thickness of the first gate insulating layer 112 between the first compensation gate electrode G3-1 and the third active region A3 is increased, and thus, the parasitic capacitance between the first compensation gate electrode G3-1 and the third active region A3 may be reduced and the kick-back phenomenon may be prevented from occurring or reduced. Moreover, the first gate insulating layer 112 between the second compensation gate electrode G3-2 and the third active region A3 includes the second layer 1122 having a high dielectric constant, and thus, even when the thickness of the first gate insulating layer 112 increases, the compensation thin film transistor T3 may react more quickly to the electrical signal applied to the compensation gate electrode G3.

The semiconductor layer 1130 including a third active region A3 is connected to the semiconductor layer 1130 including a first active region A1 (e.g., a driving active region) of the driving thin film transistor T1 as shown in FIGS. 2 and 3. In addition, in the semiconductor layer 1130, a portion corresponding to the first compensation gate electrode G3-1 is connected to a portion corresponding to the driving gate electrode G1 (e.g., the first active region A1) over the portion corresponding to the second compensation gate electrode G3-2. Accordingly, the parasitic capacitance between the first compensation gate electrode G3-1 and the third active region A3 of the compensation thin film transistor T3 may be improved. The parasitic capacitance may directly affect the voltage at the driving gate electrode G1 of the driving thin film transistor T1.

The first gate insulating layer 112 may be formed by various methods. For example, the first layer 1121 may be formed by using silicon oxide. After that, an upper portion of the first layer 1121 is at least partially removed from a portion where the second compensation gate electrode G3-2 is to be formed. The removal of the upper portion may be performed by forming a photoresist layer on the first layer 1121, removing the photoresist layer from a portion where the second layer 1122 is to be formed, and performing a dry etching process. After that, the second layer 1122 including silicon nitride may be formed at the portion from which the first layer 1121 is partially removed. The second layer 1122 may be formed by a chemical vapor deposition (CVD) method in a state in which other portions than the first layer 1121 and the second layer 1122 are shielded by using a mask. Here, a thickness of the second layer 1122 may be adjusted such that a thickness of the second compensation portion including the first layer 1121 and the second layer 1122 is equal to the thickness of the first compensation portion including the first layer 1121.

In the first compensation portion of the first gate insulating layer 112 between the first compensation gate electrode G3-1 and the third active region A3, the first layer 1121 including silicon oxide may have a thickness of about 1100 Å to about 1400 Å. In the second compensation portion of the first gate insulating layer 112 between the second compensation gate electrode G3-2 and the third active region A3, the first layer 1121 including, e.g., silicon oxide, may have a thickness of about 1000 Å to about 1200 Å and the second layer 1122 including silicon nitride may have a thickness of about 100 Å to about 300 Å. In an embodiment where the first layer 1121 has a thickness of about 1400 Å in the first compensation portion and has a thickness of about 1200 Å in the second compensation portion, the second layer 1122 may have a thickness of about 200 Å such that the thickness of the first compensation portion is equal to that of the second compensation portion, that is, 1400 Å. This feature may be applied to other embodiments and modifications thereof that will be described later.

In the first gate insulating layer 112 formed as described above, the first compensation portion of the first gate insulating layer 112 between the first compensation gate electrode G3-1 and the third active region A3 may have a single-layer structure including the first layer 1121, and the second compensation portion of the first gate insulating layer 112 between the second compensation gate electrode G3-2 and the third active region A3 may have a multi-layer structure including the first layer 1121 and the second layer 1122. In an exemplary embodiment, the second layer 1122 is closer to the second compensation gate electrode G3-2 than the first layer 1121 in the second compensation portion. For example, the distance between the second layer 1122 and second compensation gate electrode G3-2 may be less than the distance between the second compensation gate electrode G3-2 and the first layer 1121. The first layer 1121 in the second compensation portion and the first layer 1121 in the first compensation portion may be integrally formed as a single body.

In addition, as the thickness of the first gate insulating layer 112 increases, a distance between the driving gate electrode G1 of the driving thin film transistor T1 and the first active region A1 also increases. In this case, as described above with reference to the compensation thin film transistor T3, the sensitivity of the driving thin film transistor T1 may degrade. That is, when electrical signals set in advance are applied to the driving gate electrode G1, turning-on and turning-off at the driving thin film transistor T1 may not be performed at an accurate time. Also, it may not be easy to finely control the change in the electric current flowing between the driving source region S1 and the driving drain region D1 by adjusting the electrical signal applied to the driving gate electrode G1.

Figure 6:
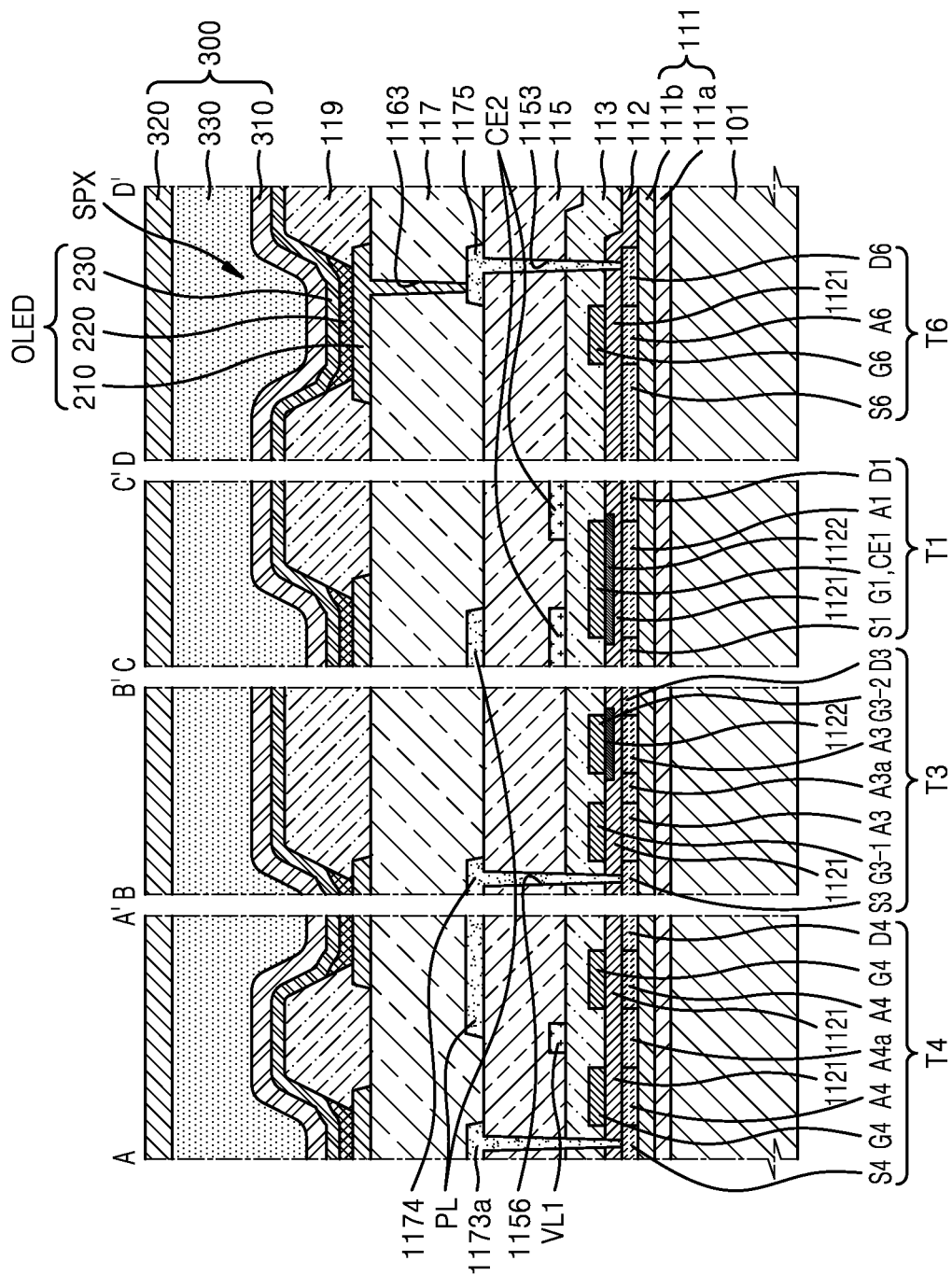
FIG. 6 is a cross-sectional view showing a portion of a display apparatus according to an exemplary embodiment of the disclosure.

FIG. 6 is a cross-sectional view of a portion of a display apparatus according to an exemplary embodiment of the disclosure that may be used to address the sensitivity issue. In FIG. 6, a first portion of the first gate insulating layer 112 between the driving gate electrode G1 and the first active region A1 has a multi-layer structure. Accordingly, the sensitivity of the driving thin film transistor T1 may be improved while preventing or reducing the kick-back phenomenon.

In an exemplary embodiment, the first portion of the first gate insulating layer 112 between the driving gate electrode G1 and the first active region A1 has a multi-layer structure like the second compensation portion of the first gate insulating layer 112 between the second compensation gate electrode G3-2 and the third active region A3. In an exemplary embodiment of the disclosure, the first portion includes the first layer 1121 including a same material as that of the first compensation portion, and the second layer 1122 includes a different material from that of the first compensation portion. In an exemplary embodiment of the disclosure, a dielectric constant of the material included in the second layer 1122 is greater than that of the material included in the first layer 1121. For example, the first layer 1121 may include silicon oxide and the second layer 1122 may include silicon nitride.

In an organic light-emitting display apparatus according to an exemplary embodiment of the disclosure, the thickness of the first gate insulating layer 112 between the first compensation gate electrode G3-1 and the third active region A3 is increased, and thus, the parasitic capacitance between the first compensation gate electrode G3-1 and the third active region A3 may be reduced and the kick-back phenomenon may be prevented from occurring or reduced. Moreover, the first gate insulating layer 112 between the driving gate electrode G1 and the first active region A1 includes the second layer 1122 having a large dielectric constant, and thus, even when the thickness of the first gate insulating layer 112 increases, the driving thin film transistor T1 may react more quickly (more sensitively) to the electrical signal applied to the driving gate electrode G1.

The first gate insulating layer 112 may be formed by various methods. For example, the first layer 1121 may be formed using silicon oxide. After that, an upper portion of the first layer 1121 is at least partially removed from portions where the first compensation gate electrode G3-2 and the driving gate electrode G1 are to be formed. This may be performed by forming a photoresist layer on the first layer 1121, removing the photoresist layer from a portion where the second layer 1122 is to be formed, and performing a dry etching process. After that, the second layer 1122 including silicon nitride may be formed at the portions from which the first layer 1121 is partially removed. The second layer 1122 may be obtained by a CVD method in a state in which other portions than the first layer 1121 and the second layer 1122 are shielded by using a mask. In an exemplary, a thickness of the second layer 1122 is adjusted such that a thickness of the second compensation portion and a thickness of the first portion including the first layer 1121 and the second layer 1122 are equal to that of the first compensation portion including the first layer 1121.

In the first gate insulating layer 112 formed as described above, the first compensation portion of the first gate insulating layer 112 between the first compensation gate electrode G3-1 and the third active region A3 may have a single-layer structure including the first layer 1121, and the second compensation portion of the first gate insulating layer 112 between the second compensation gate electrode G3-2 and the third active region A3 and the first portion of the first gate insulating layer 112 between the first initialization gate electrode G4 and the fourth active region A4 may each have a multi-layer structure including the first layer 1121 and the second layer 1122. In an embodiment of the disclosure, the second layer 1122 is closer to the second compensation gate electrode G3-2 than the first layer 1121 in the second compensation portion. In the first portion, the second layer 1122 is also closer to the first initialization gate electrode G4 than the first layer 1121. The first layer 1121 in the second compensation portion and in the first portion and the first layer 1121 in the first compensation portion may be integrally formed as a single body.

In addition, as the thickness of the first gate insulating layer 112 increases, a distance between the first initialization gate electrode G4 of the first initialization thin film transistor T4 and the fourth active region A4 also increases. In this embodiment, as described above with reference to the compensation thin film transistor T3, the sensitivity of the first initialization thin film transistor T4 may degrade. That is, when electrical signals set in advance are applied to the first initialization gate electrode G4, turning-on and turning-off of the first initialization thin film transistor T4 may not be performed at an accurate time. Also, it may not be easy to finely control the change in the electric current flowing between the first initialization source region S4 and the first initialization drain region D4 by adjusting the electrical signal applied to the first initialization gate electrode G4.

Figure 7:
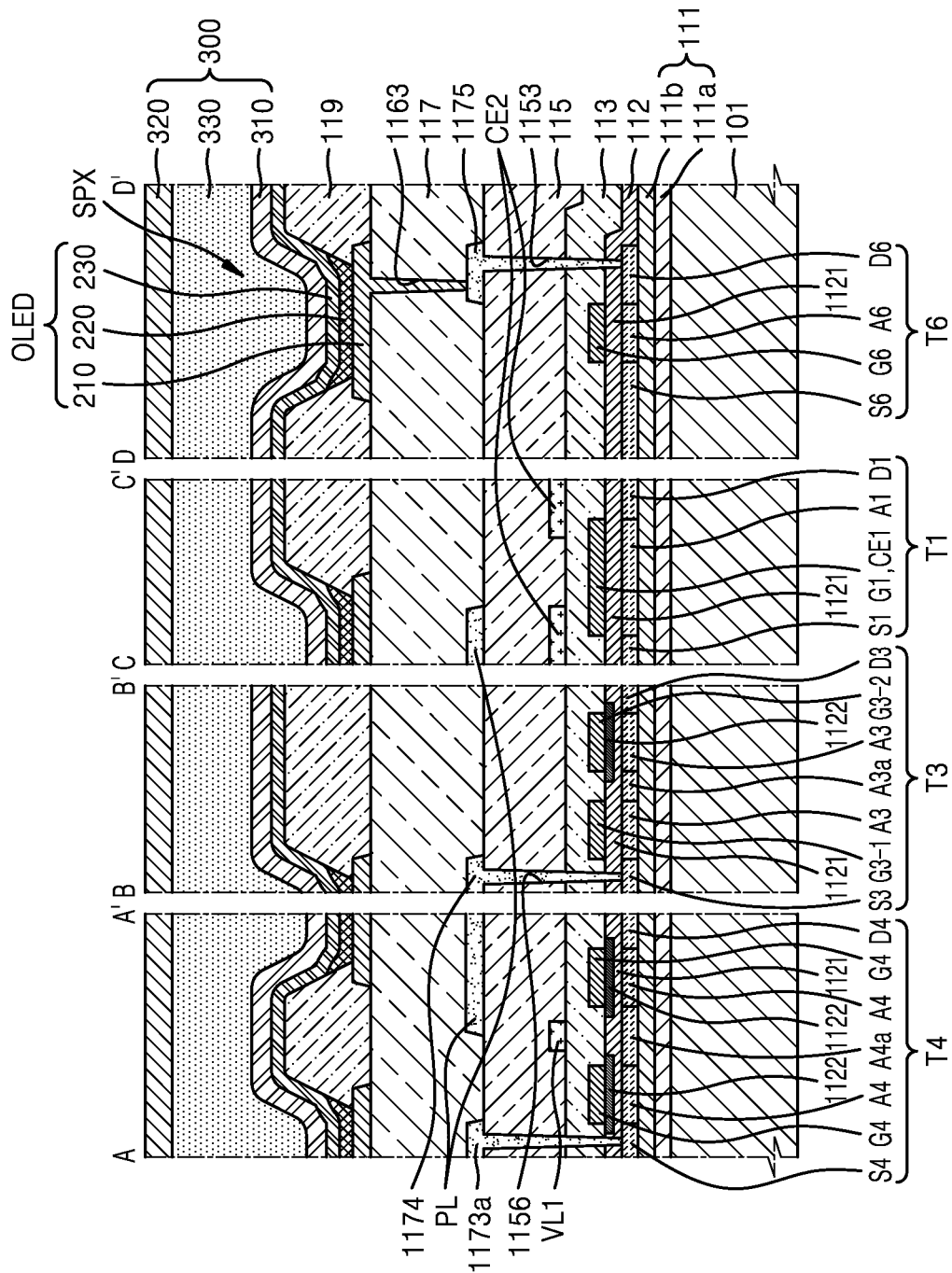
FIG. 7 is a cross-sectional view showing a portion of a display apparatus according to an exemplary embodiment of the disclosure.

FIG. 7 is a cross-sectional view of a portion of a display apparatus according to an exemplary embodiment of the disclosure that may be used to address the sensitivity issue. In FIG. 7, a fourth portion of the first gate insulating layer 112 between the first initialization gate electrode G4 and the fourth active region A4 has a multi-layer structure. Accordingly, the sensitivity of the first initialization thin film transistor T4 may be improved while preventing or reducing the kick-back phenomenon.

In an exemplary embodiment of the disclosure, a fourth portion of the first gate insulating layer 112 between the first initialization gate electrode G4 and the fourth active region A4 has a multi-layer structure like the second compensation portion of the first gate insulating layer 112 between the second compensation gate electrode G3-2 and the third active region A3. In an exemplary embodiment, the fourth portion includes the first layer 1121 including a same material as that of the first compensation portion, and the second layer 1122 including a different material from that of the first compensation portion. In an exemplary embodiment, a dielectric constant of the material included in the second layer 1122 is greater than that of the material included in the first layer 1121. For example, the first layer 1121 may include silicon oxide and the second layer 1122 may include silicon nitride.

In an organic light-emitting display apparatus according to an exemplary embodiment of the disclosure, the thickness of the first gate insulating layer 112 between the first compensation gate electrode G3-1 and the third active region A3 is increased, and thus, the parasitic capacitance between the first compensation gate electrode G3-1 and the third active region A3 may be reduced and the kick-back phenomenon may be prevented from occurring or reduced. Moreover, the first gate insulating layer 112 between the first initialization gate electrode G4 and the fourth active region A4 includes the second layer 1122 having a large dielectric constant, and thus, even when the thickness of the first gate insulating layer 112 increases, the first initialization thin film transistor T4 may react more quickly or sensitively to the electrical signal applied to the first initialization gate electrode G4.

The first gate insulating layer 112 may be formed by various methods. For example, the first layer 1121 may be formed by using silicon oxide. After that, an upper portion of the first layer 1121 is at least partially removed from portions where the second compensation gate electrode G3-2 and the first initialization gate electrode G4 are to be formed. This may be performed by forming a photoresist layer on the first layer 1121, removing the photoresist layer from a portion where the second layer 1122 is to be formed, and performing a dry etching process. After that, the second layer 1122 including silicon nitride may be formed at the portions from which the first layer 1121 is partially removed. The second layer 1122 may be obtained by a CVD method in a state in which other portions than the first layer 1121 and the second layer 1122 are shielded by using a mask. In an exemplary embodiment of the disclosure, a thickness of the second layer 1122 is adjusted such that a thickness of the second compensation portion and a thickness of the fourth portion including the first layer 1121 and the second layer 1122 are equal to that of the first compensation portion including the first layer 1121.

In the first gate insulating layer 112 formed as described above, the first compensation portion of the first gate insulating layer 112 between the first compensation gate electrode G3-1 and the third active region A3 may have a single-layer structure including the first layer 1121, and the second compensation portion of the first gate insulating layer 112 between the second compensation gate electrode G3-2 and the third active region A3 and the fourth portion of the first gate insulating layer 112 between the first initialization gate electrode G4 and the fourth active region A4 may each have a multi-layer structure including the first layer 1121 and the second layer 1122. In an exemplary embodiment of the disclosure, the second layer 1122 is closer to the second compensation gate electrode G3-2 than the first layer 1121 in the second compensation portion. In the fourth portion, the second layer 1122 is also closer to the first initialization gate electrode G4 than the first layer 1121. The first layer 1121 in the second compensation portion and the fourth portions and the first layer 1121 in the first compensation portion may be integrally formed as a single body.

Figure 8:
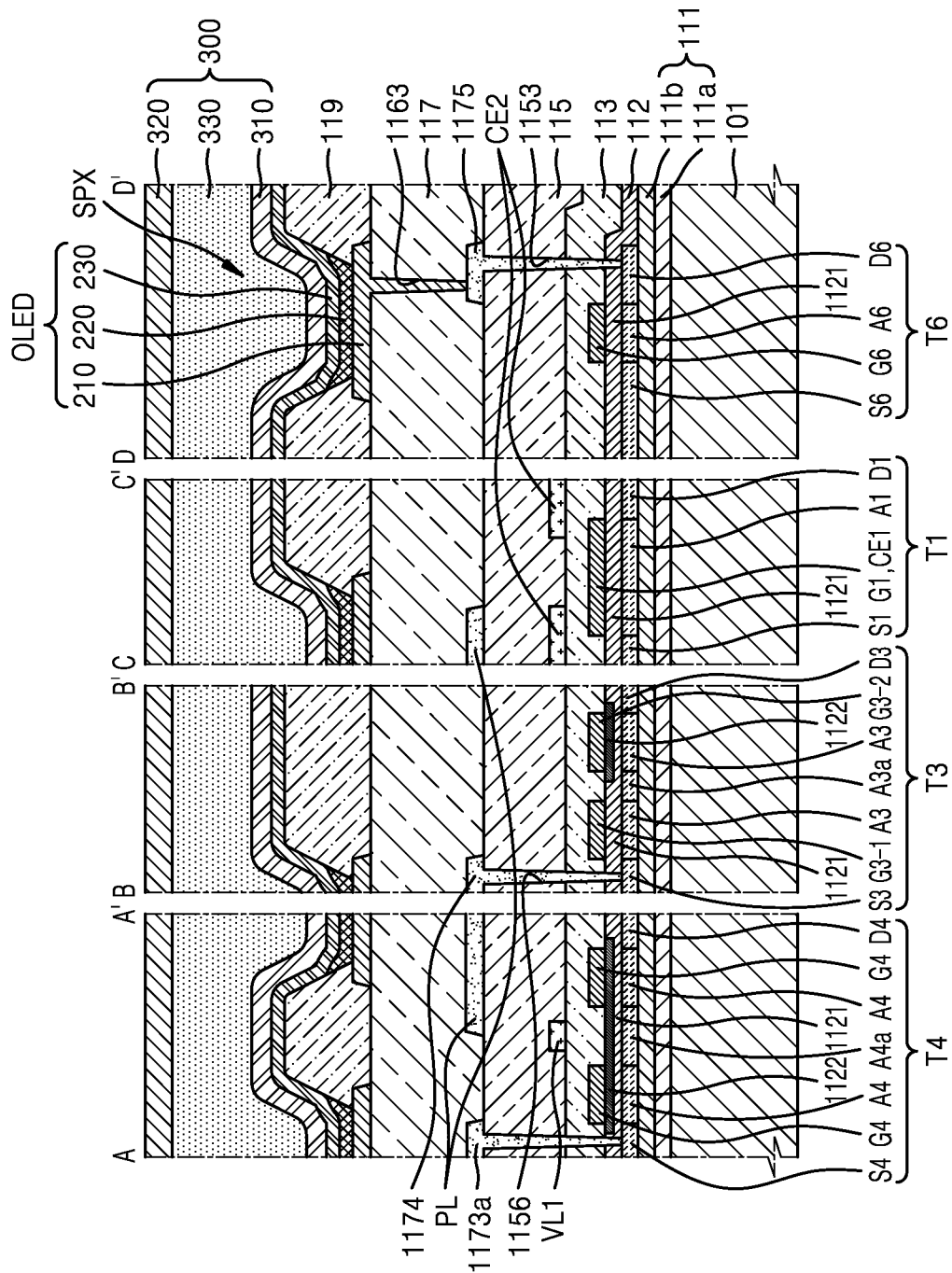
FIG. 8 is a cross-sectional view showing a portion of a display apparatus according to an exemplary embodiment of the disclosure.

In FIG. 7, because the first initialization thin film transistor T4 has dual gate electrodes, the fourth portion of the first gate insulating layer 112 between the first initialization gate electrode G4 and the fourth active region A4 is at two locations separated from each other. However, exemplary embodiments of the disclosure are not limited thereto. For example, as shown in FIG. 8 that is a cross-sectional view showing a portion of a display apparatus according to an embodiment of the disclosure, the fourth portion of the first gate insulating layer 112 between the first initialization gate electrode G4 and the fourth active region A4 corresponds to a portion between two gate electrodes of the first initialization thin film transistor T4.

Figure 9:
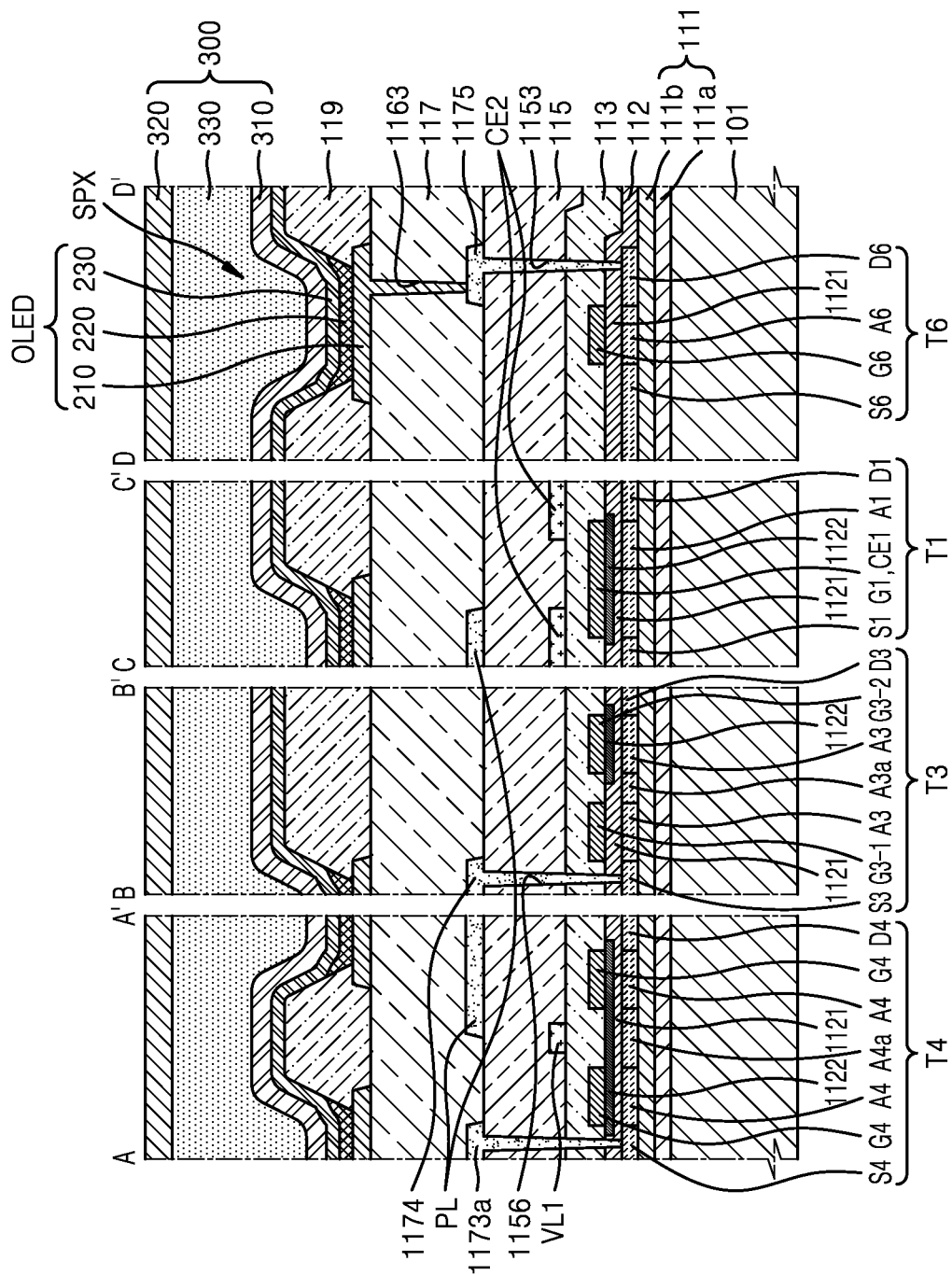
FIG. 9 is a cross-sectional view showing a portion of a display apparatus according to an exemplary embodiment of the disclosure.

The organic light-emitting display apparatus according to the embodiment described with reference to FIG. 8 and the organic light-emitting display apparatus according to the embodiment described with reference to FIG. 6 may be combined to form the organic light-emitting display apparatus of FIG. 9. That is, the first portion of the first gate insulating layer 112 (e.g., the first portion corresponding to the portion between the driving gate electrode G1 of the driving thin film transistor T1 and the first active region A1) and the fourth portion of the first gate insulating layer 112 (e.g., the fourth portion corresponding to the portion between the first initialization gate electrode G4 of the first initialization thin film transistor T4 and the fourth active region A4) may have multi-layer structures like the second compensation portion between the second compensation gate electrode G3-2 of the compensation thin film transistor T3 and the third active region A3. For example, the first initialization transistor T4 shown in FIG. 8 along line A-A' can be used to form the first initialization transistor T4 within FIG. 9 and the driving transistor T1 shown in FIG. 6 along line C-C' can be used to form the driving transistor T1 within FIG. 9.

Figure 10:
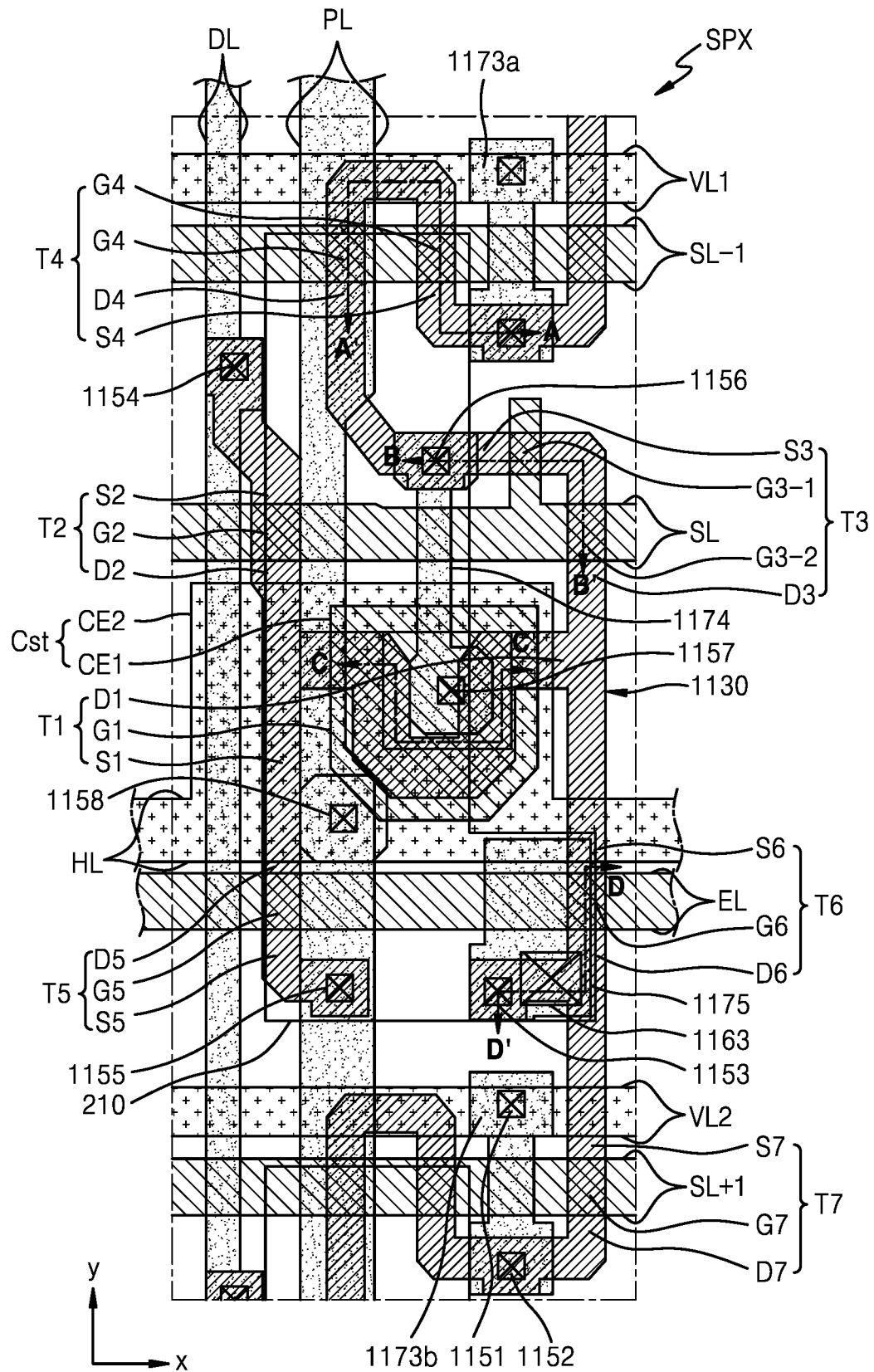
FIG. 10 is a layout showing locations of thin film transistors and a capacitor in a pixel of a display apparatus according to an exemplary embodiment of the disclosure.

FIG. 10 is a layout showing locations of thin film transistors and a capacitor in a pixel of a display apparatus according to an exemplary embodiment of the disclosure. As shown in FIG. 10, in the third active region A3, a portion overlapping the first compensation gate electrode G3-1 has an area that is less than that of a portion overlapping the second compensation gate electrode G3-2. This may be achieved by reducing the size of the first compensation gate electrode G3-1, by comparing FIG. 3 with FIG. 10.

As such, the parasitic capacitance between the first compensation gate electrode G3-1 and the third active region A3 may be reduced, and thus occurrences of the kick-back phenomenon may be prevented or reduced. Because the size of the second compensation gate electrode G3-2 is not reduced, the compensation thin film transistor T3 may react more quickly (or sensitively) to the electrical signal applied to the compensation gate electrode G3. In the organic light-emitting display apparatus described above according to an exemplary embodiment, the structure of the first gate insulating layer 112 as described above is applied.

The region in the third active region A3 (e.g., the region overlapping the first compensation gate electrode G3-1) having an area less than that of the region in the third active region A3 (e.g., the region overlapping the second compensation gate electrode G3-2) denotes that a channel length of the region overlapping the first compensation gate electrode G3-1 is less than a channel length of the region overlapping the second compensation gate electrode G3-2 in the third active region A3. The channel length denotes a length of an active region on the semiconductor layer 1130 from the source region towards the drain region.

According to at least one exemplary embodiment of the disclosure, an organic light-emitting display apparatus capable of displaying high quality images and a method of manufacturing the organic light-emitting display apparatus may be implemented. However, embodiments of the disclosure are not limited to providing higher quality images and may provide other benefits.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. An organic light-emitting display apparatus comprising:
    an organic light-emitting diode;
    a driving transistor configured to control, in response to a voltage applied to a first node connected to a driving gate electrode of the driving transistor, an amount of electric current flowing to the organic light-emitting diode from a second node connected to a power voltage line;
    a compensation transistor connected between the first node and a third node, and configured to diode-connect the driving transistor in response to a voltage applied to first and second compensation gate electrodes of the compensation transistor disposed on a same layer, wherein the third node is between the driving transistor and the organic light-emitting diode; and
    a gate insulating layer between the compensation gate electrodes and a compensation active region of the compensation transistor,
    wherein a first layer structure of the gate insulating layer between the first compensation gate electrode and the compensation active region is different from a second layer structure of the gate insulating layer between the second compensation gate electrode and the compensation active region, and
    wherein a distance between the first compensation gate electrode and the compensation active region is the same as distance between the second compensation gate electrode and the compensation active region,
    wherein the first layer structure and the second layer structure have a same thickness but a different number of layers.

2. The organic light-emitting display apparatus of claim 1, wherein a first compensation portion of the gate insulating layer between the first compensation gate electrode and the compensation active region has a single-layer structure, and a second compensation portion of the gate insulating layer between the second compensation gate electrode and the compensation active region has a multi-layer structure.

3. The organic light-emitting display apparatus of claim 2, wherein a first semiconductor layer including the compensation active region is connected to a second semiconductor layer including a driving active region of the driving transistor, and
    a first portion of the first semiconductor layer corresponding to the first compensation gate electrode is connected to a portion of the second semiconductor layer corresponding to a driving gate electrode of the driving transistor through a second portion of the first semiconductor layer corresponding to the second compensation gate electrode.

4. The organic light-emitting display apparatus of claim 2, wherein a thickness of the first compensation portion is equal to a thickness of the second compensation portion.

5. The organic light-emitting display apparatus of claim 2, wherein the second compensation portion includes a first layer including a material that is included in the first compensation portion and a second layer including a material that is different from the material included in the first compensation portion.

6. The organic light-emitting display apparatus of claim 5, wherein a dielectric constant of the material included in the second layer is greater than a dielectric constant of the material included in the first layer.

7. The organic light-emitting display apparatus of claim 5, wherein the second layer is closer to the second compensation gate electrode than the first layer.

8. The organic light-emitting display apparatus of claim 5, wherein the first layer includes silicon oxide and the second layer includes silicon nitride.

9. The organic light-emitting display apparatus of claim 5, wherein the first layer and the first compensation portion are integrally formed as a single body.

10. The organic light-emitting display apparatus of claim 2, wherein the gate insulating layer is interposed between the driving gate electrode of the driving transistor and a driving active region of the driving transistor, and a driving portion of the gate insulating layer between the driving gate electrode and the driving active region has a multi-layer structure.

11. The organic light-emitting display apparatus of claim 10, wherein the driving portion and the second compensation portion each include a first layer including a material that is included in the first compensation portion and a second layer including a material that is different from the material included in the first compensation portion.

12. The organic light-emitting display apparatus of claim 11, wherein a dielectric constant of the material included in the second layer is greater than a dielectric constant of the material included in the first layer.

13. The organic light-emitting display apparatus of claim 11, wherein the second layer is closer to the second compensation gate electrode than the first layer.

14. The organic light-emitting display apparatus of claim 11, wherein the first layer includes silicon oxide and the second layer includes silicon nitride.

15. The organic light-emitting display apparatus of claim 11, wherein the first layer and the first compensation portion are integrally formed as a single body.

16. The organic light-emitting display apparatus of claim 2, further comprising an initialization transistor connected between the first node and an initialization voltage line, the initialization transistor being configured to initialize a voltage at the driving gate electrode of the driving transistor in response to a voltage applied to an initialization gate electrode of the initialization transistor,
    wherein the gate insulating layer is interposed between the initialization gate electrode and an initialization active region of the initialization transistor, and an initialization portion of the gate insulating layer between the initialization gate electrode and the initialization active region has a multi-layer structure.

17. The organic light-emitting display apparatus of claim 16, wherein the initialization portion and the second compensation portion includes a first layer including a same material as that of the first compensation portion and a second layer including a different material from that of the first compensation portion.

18. The organic light-emitting display apparatus of claim 17, wherein a dielectric constant of the material included in the second layer is greater than a dielectric constant of the material included in the first layer.

19. The organic light-emitting display apparatus of claim 17, wherein the second layer is closer to the second compensation gate electrode than the first layer.

20. The organic light-emitting display apparatus of claim 17, wherein the first layer includes silicon oxide and the second layer includes silicon nitride.

21. The organic light-emitting display apparatus of claim 17, wherein the first layer and the first compensation portion are integrally formed as a single body.

22. The organic light-emitting display apparatus of claim 1, wherein, in the compensation active region, a portion overlapping the first compensation gate electrode has an area less than an area of a portion overlapping the second compensation gate electrode.

23. The organic light-emitting display apparatus of claim 1, wherein, in the compensation active region, a channel length of a portion overlapping the first compensation gate electrode is less than a channel length of a portion overlapping the second compensation gate electrode.

24. A pixel circuit for an organic light-emitting display apparatus comprising:
   a driving transistor configured to control an amount of electric current flowing to an organic light-emitting diode from a power voltage line;
   a compensation transistor configured to diode-connect the driving transistor in response to a voltage applied to first and second compensation gate electrodes of the compensation transistor; and
   a gate insulating layer between the compensation gate electrodes and a compensation active region of the compensation transistor,
   wherein a first layer structure of the gate insulating layer between the first compensation gate electrode and the compensation active region is different from a second layer structure of the gate insulating layer between the second compensation gate electrode and the compensation active region, and
   wherein the first layer structure and the second layer structure have a same thickness but a different number of layers.

25. An organic light-emitting display apparatus comprising:
   an organic light-emitting diode;
   a driving transistor configured to control an amount of electric current flowing to the organic light-emitting diode from a power voltage line;
   a compensation transistor configured to diode-connect the driving transistor in response to a voltage applied to first and second compensation gate electrodes of the compensation transistor; and
   a gate insulating layer between the compensation gate electrodes and a compensation active region of the compensation transistor,
   wherein a first compensation portion of the gate insulating layer between the first compensation gate electrode and the compensation active region has a single-layer structure, and a second compensation portion of the gate insulating layer between the second compensation gate electrode and the compensation active region has a multi-layer structure, and
   wherein a thickness of the first compensation portion is equal to a thickness of the second compensation portion.

26. The organic light-emitting display apparatus of claim 25, wherein the second compensation portion includes a first layer including a material that is included in the first compensation portion and a second layer including a material that is different from the material included in the first compensation portion.

* * * * *